United States Patent
Rol et al.

(10) Patent No.: US 12,196,819 B2
(45) Date of Patent: Jan. 14, 2025

(54) METHOD AND DEVICE FOR DETECTING A SHORT CIRCUIT IN AN H-BRIDGE ELECTRONIC CIRCUIT

(71) Applicant: VITESCO TECHNOLOGIES GMBH, Regensburg (DE)

(72) Inventors: Baptiste Rol, Toulouse (FR); Thierry Bavois, Toulouse (FR)

(73) Assignee: VITESCO TECHNOLOGIES GMBH, Regensburg (DE)

( * ) Notice: Subject to any disclaimer, the term of this patent is extended or adjusted under 35 U.S.C. 154(b) by 124 days.

(21) Appl. No.: 18/026,947

(22) PCT Filed: Sep. 20, 2021

(86) PCT No.: PCT/EP2021/075813
§ 371 (c)(1),
(2) Date: Mar. 17, 2023

(87) PCT Pub. No.: WO2022/063725
PCT Pub. Date: Mar. 31, 2022

(65) Prior Publication Data
US 2023/0258738 A1    Aug. 17, 2023

(30) Foreign Application Priority Data
Sep. 24, 2020  (FR) ...................... 2009692

(51) Int. Cl.
- *G01R 31/52* (2020.01)
- *G01R 31/28* (2006.01)
- *G01R 31/42* (2006.01)

(52) U.S. Cl.
CPC ......... *G01R 31/52* (2020.01); *G01R 31/2839* (2013.01); *G01R 31/42* (2013.01)

(58) Field of Classification Search
CPC .... G01R 31/00; G01R 31/005; G01R 31/006; G01R 31/28; G01R 31/2832;
(Continued)

(56) References Cited

U.S. PATENT DOCUMENTS 10,809,311 B2 * 10/2020 Pradelles ............... G01R 31/52
2017/0276715 A1  9/2017 Heinz et al.

FOREIGN PATENT DOCUMENTS

| DE | 10 2007 050 298 | 4/2009 | |
| DE | 10 2013 210 002 | 12/2014 | |
| JP | 6680227 B2 * | 4/2020 | ............. H02M 1/32 |

OTHER PUBLICATIONS

International Search Report for PCT/EP2021/075813, mailed Dec. 1, 2021, 4 pages.
(Continued)

*Primary Examiner* — Hoai-An D. Nguyen
(74) *Attorney, Agent, or Firm* — NIXON & VANDERHYE

(57) ABSTRACT

Disclosed is a method for detecting a short-circuit in an H-bridge electronic circuit, including: activating a current source on a first test branch; taking a first potential measurement of one of the output terminals; activating, if the first potential measurement is substantially different from the potential of the power supply terminal to which the first test branch is connected, a current source on a second, diametrically opposite test branch; taking a second potential measurement of each output terminal; and signalling the detection of a localized short-circuit in the output terminal having the potential resulting from the second potential measurement that is closest to the potential resulting from the first potential measurement.

20 Claims, 2 Drawing Sheets

(58) Field of Classification Search
CPC ............ G01R 31/2836; G01R 31/2839; G01R 31/40; G01R 31/42; G01R 31/50; G01R 31/52
USPC .................................................. 324/500, 512
See application file for complete search history.

(56) References Cited

OTHER PUBLICATIONS

Written Opinion of the ISA for PCT/EP2021/075813, mailed Dec. 1, 2021, 7 pages.

* cited by examiner

METHOD AND DEVICE FOR DETECTING A SHORT CIRCUIT IN AN H-BRIDGE ELECTRONIC CIRCUIT

This application is the U.S. national phase of International Application No. PCT/EP2021/075813 filed Sep. 20, 2021, which designated the U.S. and claims priority to FR Patent Application No. 2009692 filed Sep. 24, 2020, the entire contents of each of which are hereby incorporated by reference.

TECHNICAL FIELD

The invention relates to the field of electronically controlling loads, such as electric motors, using H-bridge electronic circuits.

PRIOR ART

H-bridges are electronic circuits that are extensively used for controlling direct-current electric motors in particular. H-bridges are simple assemblies generally comprising switches, such as transistors, and particularly allowing the direction of rotation of a direct-current motor to be reversed and its speed to be varied, for example, using Pulse Width Modulation (PWM) for control.

Detecting a malfunction in this type of circuit is required in some applications, such as automotive applications, which require precise monitoring of the operation of the controlled elements, in particular the electric motors located in the engine compartment of the vehicle. Many electric motors actually help to control the propulsion engine of the vehicle, and these electric motors are monitored for regulation, operating safety, and passenger safety reasons.

The current methods of the prior art for H-bridge diagnostics are generally limited to means for detecting a direct short-circuit with a terminal of the battery of the vehicle or with ground. These short-circuit detection methods are generally satisfactory for detecting a given amount of direct short-circuits, yet nevertheless suffer from the disadvantages listed hereafter.

In the complex environment of automotive applications, depending on the impedance of the load that is controlled, the voltage of the battery of the vehicle, and possible current leakages, the methods of the prior art can involve random detection, leading to false diagnostics and a poor understanding of the source of the faults.

Furthermore, when a short-circuit is detected, it is difficult to find its location in the outputs of the H-bridge. A fortiori, the physical location of the short-circuit, on the conductors in question, is precluded.

The methods of the prior art are thus not adapted to the automotive environment that is characterized by the complexity and the proximity of the cable harnesses, and are not suitable for functions involving advanced diagnostics and degraded mode operation, which require precise knowledge of the location of a short-circuit in order to be able to implement remedial or corrective strategies.

DISCLOSURE OF THE INVENTION

The aim of the invention is to improve the short-circuit detection means of the prior art.

To this end, the aim of the invention is a method for detecting a short-circuit in an electronic H-bridge circuit that comprises:
  a high potential power supply terminal;
  a low potential power supply terminal;
  a first output terminal and a second output terminal intended to be connected to a load to be controlled;
  two high side branches, which each comprise a switch connected, on the one hand, to the high potential power supply terminal and, on the other hand, to one of the output terminals;
  two low side branches, which each comprise a switch connected, on the one hand, to the low potential power supply terminal and, on the other hand, to one of the output terminals.

This method comprises the following steps:
  selecting one of said branches as a first test branch;
  activating a current source parallel to the switch of the first test branch, between the power supply terminal and the output terminal to which the first test branch is connected;
  taking a first potential measurement involving measuring the potential of one of the output terminals;
  selecting, if the potential resulting from this first potential measurement is substantially different from the potential of the power supply terminal to which the first test branch is connected, a second test branch that is diametrically opposite to the first test branch;
  activating a current source parallel to the switch of the second test branch, between the power supply terminal and the output terminal to which the second test branch is connected, and keeping the current source of the first test branch active;
  taking a second potential measurement involving measuring the potential of each output terminal;
  signalling the detection of a localized short-circuit in the output terminal having the potential resulting from the second potential measurement that is closest to the potential resulting from the first potential measurement.

According to another aim, the invention relates to an integrated circuit comprising an H-bridge electronic circuit as well as a module adapted for implementing the method described above.

The high and low potential power supply terminals refer to the notions of high and low sides that are commonly used for H-bridges.

The method for detecting a short-circuit is a general diagnostic method for marking and identifying any anomaly affecting the H-bridge and that originates from a fairly resistive, accidental connection of two cables to one another or to the ground of the vehicle. The expression "short-circuit" is used herein in the broadest sense and equally designates a direct short-circuit (a conductor is exactly returned to the potential of another conductor by a direct and non-resistive connection), and a short-circuit caused through a greater resistance and that modifies the value of a potential (partial isolation fault, current leakages, etc.).

The method according to the invention increases the level of reliability and the precision of detecting short-circuits. This method allows any short-circuits affecting the H-bridge to be safely detected, the type of short-circuit to be determined, as well as its position and the potential resulting from the short-circuit to be determined, even if the impedance of the controlled load is high compared with the impedance resulting from the short-circuit.

The invention can be implemented in any type of H-bridge and is particularly adapted for integrated circuits combining an H-bridge and computation elements equally allowing the short-circuit detection according to the invention to be carried out and known corrective or remedial measures to be implemented.

The method according to the invention can comprise the following additional features, alone or in combination:

the method further comprises a step of indicating the resulting value of the detected short-circuit, with this resulting value of the detected short-circuit being equal to the potential measured during the first potential measurement;

the method comprises a step of determining the physical position of the detected short-circuit, on the basis of the identification of the output terminal in which the short-circuit is located and of said resulting value of the short-circuit;

the first potential measurement involves measuring the potential of the output terminal to which the switch of the first test branch is connected;

after the step of taking the first potential measurement, if the potential resulting from this first potential measurement is substantially equal to the potential of the power supply terminal to which the first test branch is connected, the method comprises the following steps:

selecting a third test branch that is adjacent to the first test branch and that is located on the side of the power supply terminal that is opposite to the power supply terminal of the first test branch;

activating a current source parallel to the switch of the third test branch, between the power supply terminal and the output terminal to which the third test branch is connected;

taking a third potential measurement involving measuring the potential of one of the output terminals;

selecting, if the potential resulting from this third potential measurement is substantially equal to the potential of the power supply terminal to which the first test branch is connected, a fourth test branch that is diametrically opposite to the third test branch;

activating a current source parallel to the switch of the fourth test branch, between the power supply terminal and the output terminal to which the fourth test branch is connected, and keeping the current source of the third test branch active;

taking a fourth potential measurement involving measuring the potential of each output terminal;

signalling the detection of a localized short-circuit in the output terminal having the potential resulting from the fourth potential measurement that is furthest from the potential resulting from the third potential measurement.

after the step of taking the third potential measurement, if the potential resulting from this third potential measurement is substantially different from the potential of the power supply terminal to which the first test branch is connected, the method comprises a step of signalling the absence of a short-circuit;

the method further comprises a step of indicating the resulting value of the detected short-circuit, with this resulting value of the detected short-circuit being equal to the potential measured during the third potential measurement;

the method comprises a step of determining the physical position of the detected short-circuit, on the basis of the identification of the output terminal in which the short-circuit is located and of said resulting value of the short-circuit;

the third potential measurement involves measuring the potential of the output terminal to which the switch of the third test branch is connected;

the current sources have identical or different bias voltages.

PRESENTATION OF THE FIGURES

Further features and advantages of the invention will become apparent from the following non-limiting description, with reference to the accompanying drawings, in which.

DETAILED DESCRIPTION

Figure 1:
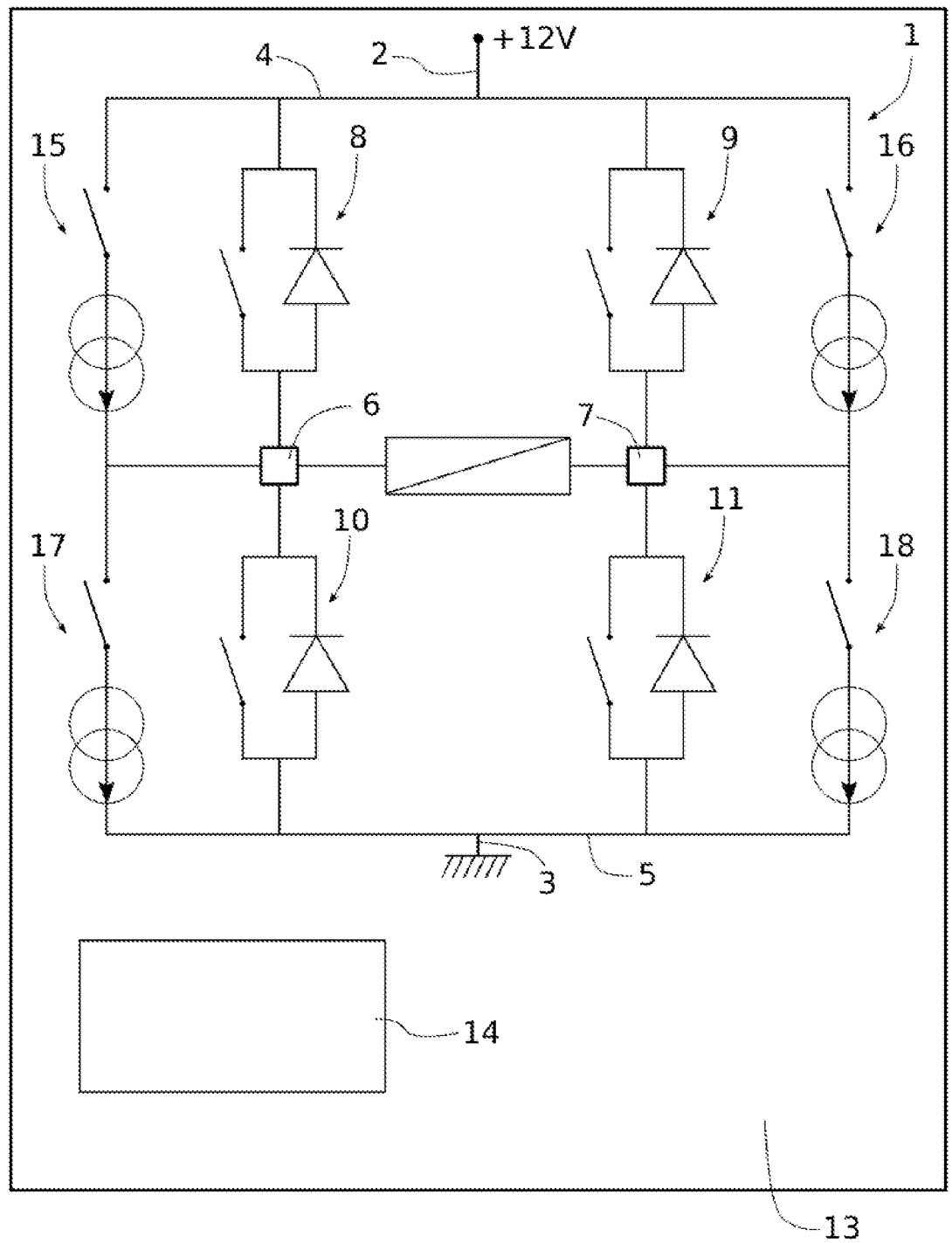
FIG. 1 illustrates an integrated circuit according to the invention, comprising an H-bridge.

FIG. 1 shows an H-bridge electronic circuit 1, arranged in an integrated circuit 13.

In the present example, this H-bridge is designed for an automobile application and is powered by the voltage of the battery of a vehicle in order to control a load 12. The load 12 is, for example, an electric motor activating a valve or a flap for controlling the propulsion engine of the vehicle. As a variant, the load 12 can be formed by any element requiring an H-bridge for the control thereof.

The H-bridge in this case comprises a high potential power supply terminal 2, which is connected to the positive terminal of the battery of the vehicle (for example, +12 volts potential), as well as a low potential power supply terminal 3, which in this example is connected to the ground of the vehicle.

The H-bridge thus comprises a "high side" 4 powered by the high potential terminal 2, and a "low side" 5 powered by the low potential terminal 3.

The H-bridge comprises two output terminals 6, 7 connected to the terminals of the load 12. These output terminals 6, 7 are identified in the present description by the qualifying terms "left terminal" 6 and "right terminal" 7, with reference to the diagram of FIG. 1.

Between each side (high 4 or low 5) and the output terminals 6, 7, the H-bridge comprises four branches each provided with a switch 8, 9, 10, 11. In the present example, the switches 8, 9, 10, 11 are produced by transistors schematically shown in FIG. 1 by a diode and a switch (the control part of the transistors has not been shown).

In the present example, the H-bridge circuit 1 is integrated within a specialized integrated circuit 13 of the ASIC (Application Specific Integrated Circuit) type, which comprises, in addition to the H-bridge, a module 14 comprising computation means (a microcontroller, for example) adapted to control the switches 8, 9, 10, 11 and to perform the diagnostics of the H-bridge. The module 14 also comprises voltage measurement means adapted to measure the potential of each output terminal 6, 7 of the H-bridge.

The H-bridge thus comprises:

a high side branch comprising a switch 8 connected between the high potential terminal 2 and the left output terminal 6;

another high side branch comprising a switch 9 connected between the high potential terminal 2 and the right output terminal 7;

a low side branch comprising a switch 10 connected between the low potential terminal 3 and the left output terminal 6;

another low side branch comprising a switch 11 connected between the low potential terminal 3 and the right output terminal 7.

The module 14 controls the switches 8, 9, 10, 11 in a conventional manner for an H-bridge, as a function of the control intended for the load 12.

The H-bridge further comprises means for detecting a short-circuit including four current sources 15, 16, 17, 18 each disposed parallel to a switch 8, 9, 10, 11.

In this example:
a current source 15 is disposed parallel to the switch 8;
a current source 16 is disposed parallel to the switch 9;
a current source 17 is disposed parallel to the switch 10;
a current source 18 is disposed parallel to the switch 11.

The current sources 15 to 18 are each simply schematically shown using the symbol of a current source in series with a switch allowing it to be activated or deactivated.

The module 14 is adapted to activate a mode for detecting a short-circuit allowing anomalies affecting the H-bridge to be detected. This mode for detecting a short-circuit is based on the use of the current sources 15 to 18 and is implemented when stopped, i.e., when the load 12 is not controlled. This detection mode can be activated, for example, each time the vehicle is turned on, as a start-up routine, or during any other phase when the load 12 is stopped.

Figure 2:
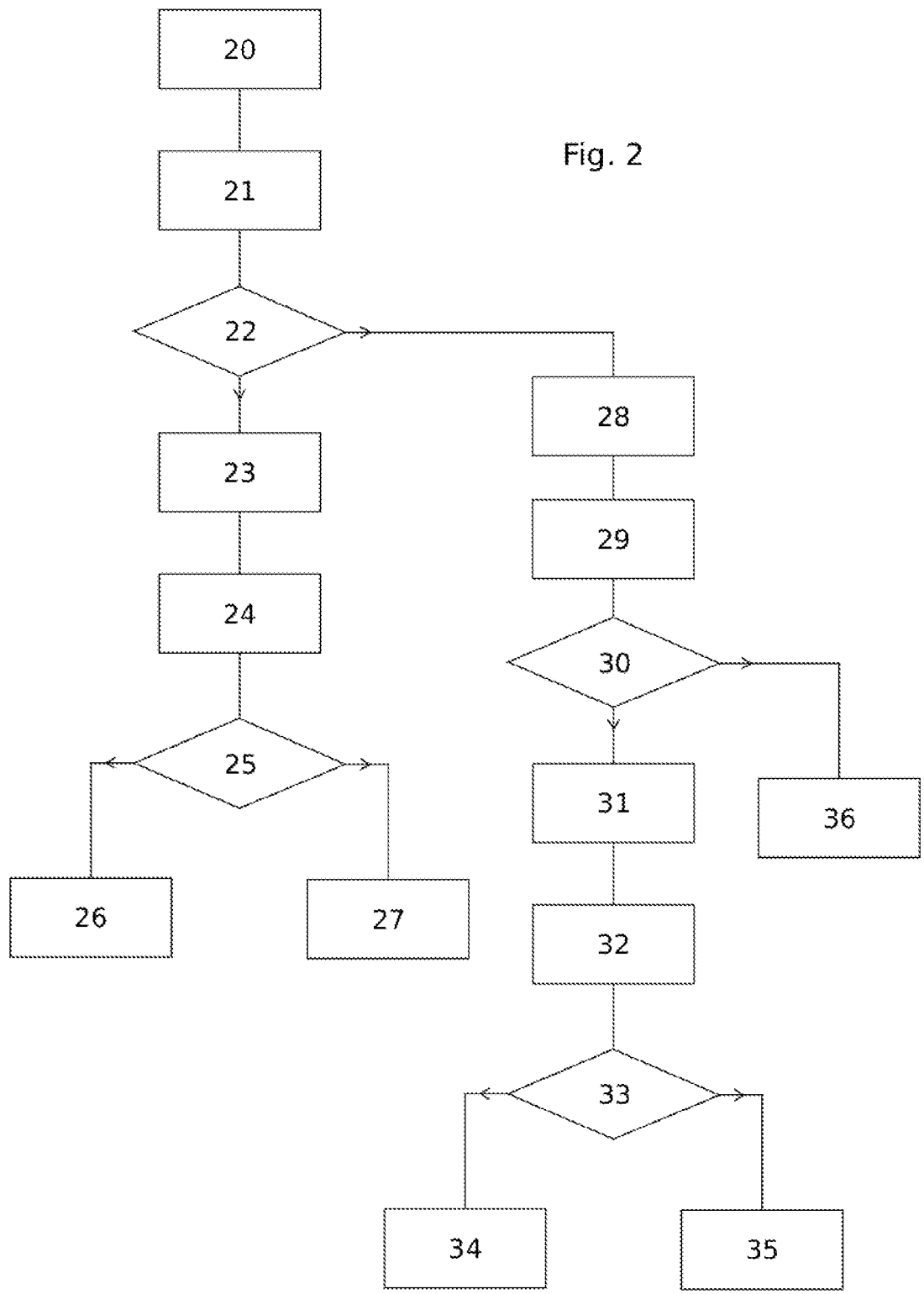
FIG. 2 is a diagram illustrating the method according to the invention.

The method for detecting a short-circuit of the H-bridge is described with reference to the diagram of FIG. 2.

The method starts with a step 20, in which one of the current sources 15 to 18 is activated. To this end, a branch of the H-bridge is initially selected as a first test branch. Any branch of the H-bridge can be the first test branch. In the example described, the branch containing the switch 10 is selected as the first test branch.

The current source 17 in this case is therefore activated first, while the other current sources 15, 16, 18 remain deactivated.

A subsequent step 21 involves carrying out a first potential measurement, during which the potential of the output terminal 6 corresponding to the first test branch is measured. However, the presence of the load 12 implies that the potentials of the two outputs 6, 7 are equal.

The next step 22 involves comparing the measured potential of the output terminal 6 with the potential on the (high or low) side of the first test branch. In this example, with the switch 10 being connected to the low side 5, the potential measured for the output terminal 6 is compared with the potential of the low potential terminal 3, i.e., with the reference potential. If these potentials are substantially different, the method proceeds to step 23. For example, if the potential measured during the first potential measurement is located outside the range [−0.5 V; +0.5 V], in this case it is considered to be different from 0 V and the method proceeds to step 23. Since the first test branch is on the low side 5, the reference potential of 0 V is indeed that which must be obtained during this first potential measurement, if no short-circuit disrupts the H-bridge.

When proceeding to step 23, the potential originating from the first potential measurement is, as previously indicated, different from the ground potential, which corresponds to an abnormal value and indicates the presence of a short-circuit that will be more precisely characterized throughout the remainder of the method.

During step 23, another branch of the H-bridge is selected as a second test branch. This second test branch is diametrically opposite to the first test branch. In the present example, this is the branch comprising the switch 9. The expression "diametrically opposite" used herein describes an element that is located on the other (high or low) side, as well as on the other (right or left) edge, relative to a considered element.

In the example described, the current source 16 is then activated in addition to the current source 17 that remains activated, while the other current sources 15, 18 remain deactivated.

A second potential measurement is then taken in step 24. The potential of each of the output terminals 6, 7 is measured during this step.

The next step 25 involves comparing the potential measurements of the two terminals 6, 7, originating from the second measurement, with the potential originating from the first measurement, and proceeding to step 26 or to step 27 according to the following criteria:

if the potential of the left output 6, which potential is measured during the second potential measurement, is closer to the potential measured during the first potential measurement than the potential of the right output 7, which potential is measured during the second potential measurement, then the method proceeds to step 26;

if the potential of the right output 7, which potential is measured during the second potential measurement, is closer to the potential measured during the first potential measurement than the potential of the left output 6, which potential is measured during the second potential measurement, then the method proceeds to step 27.

Steps 26 and 27 relate to the location of the short-circuit, i.e., the short-circuit that was identified in step 23 will now be located: it can be located in the conductors that are connected to the left output terminal 6 or in the conductors that are connected to the right output terminal 7.

When the method reaches step 26 this means that the short-circuit affects the left output 6 of the H-bridge. Step 26 then involves signalling the detection of a short-circuit in this left output 6. This signalling can be carried out using any suitable means as a function of the application, for example, by activating a flag on the module 14 that is designed to be read and taken into account by corrective or remedial devices of the vehicle (devices that are known and are not described herein).

When the method reaches step 27 this means that the short-circuit affects the right output 7 of the H-bridge. Step 27 then involves signalling the detection of this short-circuit in the left output 6, as previously, for example, by activating a flag.

In other words, proceeding to steps 26 or 27 occurs by detecting the output terminal 6, 7 having the potential resulting from the second potential measurement that is closest to the potential that was measured during the first potential measurement.

In the particular case of this embodiment:
during step 26, the potential of the left output 6 is equal to the potential originating from the first potential measurement, while the potential of the right output 7 is different from the potential originating from the first potential measurement;
during step 27, the potential of the left output 6 is different from the potential originating from the first potential measurement, while the potential of the right output 7 is equal to the potential originating from the first potential measurement.

The short-circuit indication of steps 26, 27, respectively, corresponds to a situation where:
a short-circuit is present in the cables of the vehicle that are connected to the left output terminal 6, and to the right output terminal 7, respectively;
this short-circuit has a resulting value that is equal to the potential measured during the first potential measurement, i.e., the short-circuited cables have potentials leading to this resulting value, when they are short-circuited. The resulting value of the short-circuit thus assists in identifying the cables involved in the short-circuit.

Indeed, if, for example, the resulting value of the short-circuit is a potential of +12 V, this means that the output conductor connected to the output terminal involved has directly short-circuited with a conductor connected to the positive terminal of the battery of the vehicle. According to another example, if the resulting value of the short-circuit is a potential of −1 V, this means that the output conductor connected to the output terminal involved is short-circuited with a conductor having a potential that is less than the reference potential of the circuit.

Thus, the method allows short-circuits to be identified and located even outside the conventional range of 0 V to 12 V, which is increasingly required in the automobile field in a context involving increasing complexity where many circuits can have different reference potentials, and where the bodywork of a vehicle, taken as ground, can have different potentials in remote regions.

The method thus can comprise an additional step of determining the physical position of the short-circuit on the basis of the identification of the output terminal in which the short-circuit is located and of said resulting value of the short-circuit, i.e., a step of identifying the wiring harness of the vehicle that is connected to the output terminal involved and that comprises the cables likely to produce a short-circuit with such a resulting value. As a variant, the current sources can have different bias voltages between them, in order to facilitate identification.

Furthermore, in contrast with the previous description, if, during step 22, the potential of the output terminal 6 measured during the first potential measurement is substantially equal to the potential of the low potential terminal 3, the method then proceeds to step 28. In this example, if the potential measured during the first potential measurement is located in the range [−0.5 V; +0.5 V], the method proceeds to step 28.

Proceeding to step 28 corresponds to the normal case of the absence of a short-circuit, which results in a potential of the output terminal 6 that suitably converges toward the reference potential, with the first test branch being a low side branch 5. However, an ambiguity can be created by a short-circuit precisely returning the output terminal 6 to the reference potential, independently of whether or not the current source 17 is activated.

In order to increase the precision of the method by removing this ambiguity, it is possible, during step 28, to select a branch of the H-bridge as a test branch (it will be called "third test branch" hereafter), with this branch being adjacent to the first test branch (i.e., the same edge, left or right), and being opposite to the first test branch (i.e., on the opposite side, high or low).

In the present example, the branch containing the switch 8 is selected as a third test branch (this third test branch is on the high side, while the first test branch was on the low side, with these branches both being on the same left edge). During step 28, the current source 15 is then activated while the other current sources 16, 17, 18 remain deactivated.

A subsequent step 29 involves taking a potential measurement (which is called "third potential measurement" in order to identify it relative to the other potential measurements of the method). This third potential measurement involves measuring the potential of the output terminal 6 corresponding to the third test branch. As in step 21, the presence of the load 12 nevertheless implies that the potentials of the two outputs 6, 7 are equal.

The next step 30 involves comparing the potential measured during the third potential measurement with the potential corresponding to the side of the first test branch. In this example, with the first test branch (switch 10) being on the low side, the potential measured at the output terminal 6 is compared with the potential of the low potential terminal 3, i.e., with the reference potential 0 V. If these potentials are substantially different, the method proceeds to step 31. For example, if the potential measured during the third potential measurement is greater than 0.5 V, it is considered in this case that it is substantially different from 0 V and the method proceeds to step 36. The potential of 0 V is indeed that which will be obtained during the third potential measurement if a short-circuit specifically disrupts the H-bridge so that the output terminals 6, 7 are constantly at the potential 0 V. When the potential originating from the third potential measurement is thus different from the low potential 0 (and is a priori equal to +12 V), this means that this specific short-circuit is not present, and that the previously mentioned ambiguity is high. In this case, the method then proceeds to the final step of the method, step 36, with no short-circuit having been detected.

Furthermore, if, during step 30, the potential measured during the third potential measurement is equal to the potential corresponding to the side of the first test branch (0 V in this example), this means that the detection of step 22 must not conclude that there is no short-circuit since it is actually a short-circuit artificially returning the potential of the output terminals 6, 7 as 0 V that is responsible for this behavior.

Proceeding to step 31 corresponds to detecting a short-circuit in either one of the output terminals 6, 7, with this short-circuit having a potential of 0 V as the resulting value. The following steps allow this short-circuit to be located.

During step 31, another branch of the H-bridge is selected as a fourth test branch. This fourth test branch is diametrically opposite to the third test branch. In the present example, this is the branch comprising the switch 11.

In the example described, the current source 18 of the fourth test branch is therefore in turn activated, in addition to the current source 15, which also remains activated, while the other current sources 16, 17 remain deactivated.

A fourth potential measurement is then taken during step 32, with this measurement involving measuring the potential of each of the output terminals 6, 7.

The next step 33 involves comparing the potential measurements of the two terminals 6, 7 originating from the fourth potential measurement, with the potential originating from the third potential measurement (which is equal to the potential originating from the first potential measurement, 0 V in the present example), and proceeding to step 34 or to step 35 according to the following criteria:

if the potential of the left output 6, which potential is measured during the fourth potential measurement, is further from the potential measured during the third potential measurement than the potential of the right output 7, which potential is measured during the fourth potential measurement, then the method proceeds to step 34;

if the potential of the right output 7, which potential is measured during the fourth potential measurement, is further from the potential measured during the third potential measurement than the potential of the left output 6, which potential is measured during the fourth potential measurement, then the method proceeds to step 35.

When the method reaches step 34 this means that the short-circuit affects the left output 6 of the H-bridge. Step 34 then involves indicating the detection of a short-circuit in this left output 6, for example, by activating a flag as previously.

When the method reaches step 35 this means that the short-circuit affects the right output 7 of the H-bridge. Step 35 then involves indicating the detection of this short-circuit in this left output 7, for example, by activating a flag as previously.

In other words, the transition to steps 34 or 35 is carried out by detecting the output terminal 6, 7 having the potential resulting from the fourth potential measurement that is furthest from the potential of the first and third potential measurements (0 V in this example).

In the particular case of this embodiment:
during step 34, the potential of the right output 7 is equal to the potential originating from the third potential measurement, and is substantially zero, while the potential of the left output 6 differs from zero;
during step 35, the potential of the right output 7 differs from zero, while the potential of the left output 6 is substantially equal to zero.

The short-circuit indication of steps 34, 35, respectively, corresponds to a situation where:
a short-circuit is present in the cables of the vehicle that are connected to the left output terminal 6 and to the right output terminal 7, respectively;
this short-circuit has a resulting value that is equal to zero, i.e., the short-circuited cables have potentials leading to a zero potential, when they are short-circuited. The resulting value of the short-circuit thus assists in identifying the cables involved in the short-circuit, i.e., in this example, the cables connected to the reference potential that are in contact with cables connected to the output terminal involved.

As previously, the method can thus comprise an additional step of determining the physical position of the short-circuit on the basis of the identification of the output terminal in which the short-circuit is located and of said resulting value of the short-circuit, i.e., a step of identifying the wiring harness of the vehicle that is connected to the output terminal involved and that comprises the cables at 0 V that are likely to produce a short-circuit with such a resulting value of 0 V. Also as a variant, the current sources can have different bias voltages between them, in order to facilitate the identification.

The method thus allows a short-circuit to be detected, the potential resulting from the short-circuit to be provided, and the output terminal 6, 7 and the conductors involved to be indicated.

The diagnostic method can start with any of the current sources 15 to 18, other than that provided herein, by way of an example as first and third test branches, as long as the sequence proceeds as described. Thus, when no short-circuit is detected, the potentials of the left 6 and right 7 output terminals will be measured at 12 volts when the current sources 15 and 16 are activated, while these two potentials will be measured at 0 volts (reference potential) when activating the low side 5 current sources 17, 18. In addition, activating two diametrically opposite current sources makes it possible to determine whether the resulting potential increases or decreases, which allows the (left or right) edge of the short-circuit to be determined.

Furthermore, the H-bridge can be integrated within a larger bridge structure, comprising additional switching branches.

The invention claimed is:

1. A method for detecting a short-circuit in an H-bridge electronic circuit that comprises:
   a high potential power supply terminal;
   a low potential power supply terminal;
   a first output terminal and a second output terminal intended to be connected to a load to be controlled;
   two high side branches, which each comprise a switch connected both to the high potential power supply terminal and also to one of the output terminals;
   two low side branches, which each comprise a switch connected both to the low potential power supply terminal and also to one of the output terminals;
said method comprising:
   selecting one of said branches as a first test branch;
   activating a current source parallel to the switch of the first test branch, between the power supply terminal and the output terminal to which the first test branch is connected;
   taking a first potential measurement involving measuring the potential of one of the output terminals;
   selecting, if the potential resulting from this first potential measurement is substantially different from the potential of the power supply terminal to which the first test branch is connected, a second test branch that is diametrically opposite to the first test branch;
   activating a current source parallel to the switch of the second test branch, between the power supply terminal and the output terminal to which the second test branch is connected, and keeping the current source of the first test branch active;
   taking a second potential measurement involving measuring the potential of each output terminal;
   signalling the detection of a localized short-circuit in the output terminal having the potential resulting from the second potential measurement that is closest to the potential resulting from the first potential measurement.

2. The method as claimed in claim 1, further comprising a step of indicating the resulting value of the detected short-circuit, with this resulting value of the detected short-circuit being equal to the potential measured during the first potential measurement.

3. The method as claimed in claim 2, further comprising a step of determining the physical position of the detected short-circuit, on the basis of the identification of the output terminal in which the short-circuit is located and of said resulting value of the short-circuit.

4. The method as claimed in claim 1, wherein the first potential measurement involves measuring the potential of the output terminal to which the switch of the first test branch is connected.

5. The method as claimed in claim 1, wherein, after the step of taking the first potential measurement, if the potential resulting from this first potential measurement is substantially equal to the potential of the power supply terminal to which the first test branch is connected, the method comprises the following steps:
   selecting a third test branch that is adjacent to the first test branch and that is located on the side of the power supply terminal that is opposite to the power supply terminal of the first test branch;

activating a current source parallel to the switch of the third test branch, between the power supply terminal and the output terminal to which the third test branch is connected;

taking a third potential measurement involving measuring the potential of one of the output terminals;

selecting, if the potential resulting from this third potential measurement is substantially equal to the potential of the power supply terminal to which the first test branch is connected, a fourth test branch that is diametrically opposite to the third test branch;

activating a current source parallel to the switch of the fourth test branch, between the power supply the terminal and output terminal to which the fourth test branch is connected, and keeping the current source of the third test branch active;

taking a fourth potential measurement involving measuring the potential of each output terminal;

signalling the detection of a localized short-circuit in the output terminal having the potential resulting from the fourth potential measurement that is furthest from the potential resulting from the third potential measurement.

6. The method as claimed in claim 5, wherein, after the step of taking the third potential measurement, if the potential resulting from this third potential measurement is substantially different from the potential of the power supply terminal to which the first test branch is connected, the method comprises a step of signalling the absence of a short-circuit.

7. The method as claimed in claim 5, further comprising a step of indicating the resulting value of the detected short-circuit, with this resulting value of the detected short-circuit being equal to the potential measured during the third potential measurement.

8. The method as claimed in claim 7, further comprising a step of determining the physical position of the detected short-circuit, on the basis of the identification of the output terminal in which the short-circuit is located and of said resulting value of the short-circuit.

9. The method as claimed in claim 5, wherein the third potential measurement involves measuring the potential of the output terminal to which the switch of the third test branch is connected.

10. The method as claimed in claim 1, wherein the current sources have identical bias voltages.

11. The method as claimed in claim 1, wherein the current sources have different bias voltages.

12. An integrated circuit comprising an electronic H-bridge circuit and a module adapted for implementing the method according to claim 1.

13. The method as claimed in claim 2, wherein the first potential measurement involves measuring the potential of the output terminal to which the switch of the first test branch is connected.

14. The method as claimed in claim 3, wherein the first potential measurement involves measuring the potential of the output terminal to which the switch of the first test branch is connected.

15. The method as claimed in claim 2, wherein, after the step of taking the first potential measurement, if the potential resulting from this first potential measurement is substantially equal to the potential of the power supply terminal to which the first test branch is connected, the method comprises the following steps:

selecting a third test branch that is adjacent to the first test branch and that is located on the side of the power supply terminal that is opposite to the power supply terminal of the first test branch;

activating a current source parallel to the switch of the third test branch, between the power supply terminal and the output terminal to which the third test branch is connected;

taking a third potential measurement involving measuring the potential of one of the output terminals;

selecting, if the potential resulting from this third potential measurement is substantially equal to the potential of the power supply terminal to which the first test branch is connected, a fourth test branch that is diametrically opposite to the third test branch;

activating a current source parallel to the switch of the fourth test branch, between the power supply terminal and the output terminal to which the fourth test branch is connected, and keeping the current source of the third test branch active;

taking a fourth potential measurement involving measuring the potential of each output terminal;

signalling the detection of a localized short-circuit in the output terminal having the potential resulting from the fourth potential measurement that is furthest from the potential resulting from the third potential measurement.

16. The method as claimed in claim 3, wherein, after the step of taking the first potential measurement, if the potential resulting from this first potential measurement is substantially equal to the potential of the power supply terminal to which the first test branch is connected, the method comprises the following steps:

selecting a third test branch that is adjacent to the first test branch and that is located on the side of the power supply terminal that is opposite to the power supply terminal of the first test branch;

activating a current source parallel to the switch of the third test branch, between the power supply terminal and the output terminal to which the third test branch is connected;

taking a third potential measurement involving measuring the potential of one of the output terminals;

selecting, if the potential resulting from this third potential measurement is substantially equal to the potential of the power supply terminal to which the first test branch is connected, a fourth test branch that is diametrically opposite to the third test branch;

activating a current source parallel to the switch of the fourth test branch, between the power supply terminal and the output terminal to which the fourth test branch is connected, and keeping the current source of the third test branch active;

taking a fourth potential measurement involving measuring the potential of each output terminal;

signalling the detection of a localized short-circuit in the output terminal having the potential resulting from the fourth potential measurement that is furthest from the potential resulting from the third potential measurement.

17. The method as claimed in claim 4, wherein, after the step of taking the first potential measurement, if the potential resulting from this first potential measurement is substantially equal to the potential of the power supply terminal to which the first test branch is connected, the method comprises the following steps:

selecting a third test branch that is adjacent to the first test branch and that is located on the side of the power supply terminal that is opposite to the power supply terminal of the first test branch;

activating a current source parallel to the switch of the third test branch, between the power supply terminal and the output terminal to which the third test branch is connected;

taking a third potential measurement involving measuring the potential of one of the output terminals;

selecting, if the potential resulting from this third potential measurement is substantially equal to the potential of the power supply terminal to which the first test branch is connected, a fourth test branch that is diametrically opposite to the third test branch;

activating a current source parallel to the switch of the fourth test branch, between the power supply terminal and the output terminal to which the fourth test branch is connected, and keeping the current source of the third test branch active;

taking a fourth potential measurement involving measuring the potential of each output terminal;

signalling the detection of a localized short-circuit in the output terminal having the potential resulting from the fourth potential measurement that is furthest from the potential resulting from the third potential measurement.

18. The method as claimed in claim 6, further comprising a step of indicating the resulting value of the detected short-circuit, with this resulting value of the detected short-circuit being equal to the potential measured during the third potential measurement.

19. The method as claimed in claim 6, wherein the third potential measurement involves measuring the potential of the output terminal to which the switch of the third test branch is connected.

20. The method as claimed in claim 7, wherein the third potential measurement involves measuring the potential of the output terminal to which the switch of the third test branch is connected.

* * * * *